United States Patent
Lee

(10) Patent No.: US 12,446,471 B2
(45) Date of Patent: Oct. 14, 2025

(54) PIEZOELECTRIC SINGLE-CRYSTAL ELEMENT, MEMS DEVICE USING SAME, AND METHOD FOR MANUFACTURING SAME

(71) Applicant: IBULE PHOTONICS, Incheon (KR)

(72) Inventor: Sang Goo Lee, Incheon (KR)

(73) Assignee: IBULE PHOTONICS, Incheon (KR)

( * ) Notice: Subject to any disclaimer, the term of this patent is extended or adjusted under 35 U.S.C. 154(b) by 452 days.

(21) Appl. No.: 18/082,580

(22) Filed: Dec. 16, 2022

(65) Prior Publication Data

US 2023/0120240 A1    Apr. 20, 2023

Related U.S. Application Data

(63) Continuation of application No. PCT/KR2021/006803, filed on Jun. 1, 2021.

(30) Foreign Application Priority Data

Jul. 2, 2020 (KR) .................. 10-2020-0081561

(51) Int. Cl.
| | |
|---|---|
| *H10N 30/30* | (2023.01) |
| *B81B 7/02* | (2006.01) |
| *B81C 1/00* | (2006.01) |
| *H03H 9/56* | (2006.01) |
| *H10N 30/05* | (2023.01) |
| *H10N 30/87* | (2023.01) |

(52) U.S. Cl.
CPC ............. *H10N 30/302* (2023.02); *B81B 7/02* (2013.01); *B81C 1/00015* (2013.01);
(Continued)

(58) Field of Classification Search
CPC ............. H10N 30/073; H10N 30/2047; H10N 30/306; H10N 30/308; H10N 30/8548;
(Continued)

(56) References Cited

U.S. PATENT DOCUMENTS

| | | |
|---|---|---|
| 2005/0127780 A1 | 6/2005 | Ifuku et al. |
| 2006/0042541 A1 | 3/2006 | Eun et al. |

(Continued)

FOREIGN PATENT DOCUMENTS

| | | |
|---|---|---|
| KR | 10-0570585 B1 | 4/2006 |
| KR | 10-0643825 B1 | 11/2006 |

(Continued)

OTHER PUBLICATIONS

The extended European search report of European Patent Application No. 21833900.0 mailed Jun. 5, 2024.
(Continued)

*Primary Examiner* — Moazzam Hossain
(74) *Attorney, Agent, or Firm* — Revolution IP, PLLC

(57) ABSTRACT

The present disclosure relates to a piezoelectric single-crystal element, a MEMS device using same, and a method for manufacturing same, wherein the piezoelectric single-crystal element includes a wafer, a lower electrode stacked on the wafer, a piezoelectric single-crystal thin film stacked on the lower electrode, and an upper electrode stacked on the piezoelectric single-crystal thin film, wherein the piezoelectric single-crystal thin film is composed of PMN-PT, PIN-PMN-PT or Mn:PIN-PMN-PT, and the piezoelectric single-crystal thin film has a polarization direction set to a <001> axis, a <011> axis or a <111> axis, and a MEMS device using same.

12 Claims, 10 Drawing Sheets

(52) U.S. Cl.
CPC ............ *H03H 9/564* (2013.01); *H10N 30/05* (2023.02); *H10N 30/872* (2023.02); *B81B 2201/0285* (2013.01); *B81B 2203/0118* (2013.01); *B81B 2203/0353* (2013.01); *B81B 2203/04* (2013.01); *B81C 2201/013* (2013.01); *B81C 2201/0181* (2013.01)

(58) Field of Classification Search
CPC ......... H10N 30/074; H10N 30/01–098; H10N 30/2042–2046; H03H 2003/0442; H03H 9/02118; H03H 9/132; H03H 9/173; B06B 1/06–0696; B81B 2203/0118
See application file for complete search history.

(56) References Cited

U.S. PATENT DOCUMENTS

| | | | | |
|---|---|---|---|---|
| 2009/0050987 | A1* | 2/2009 | Peng | ................... H10N 30/072 257/414 |
| 2009/0273257 | A1 | 11/2009 | Ifuku et al. | |
| 2014/0368087 | A1* | 12/2014 | Hiraoka | ............... H10N 30/802 29/25.35 |
| 2019/0068155 | A1* | 2/2019 | Kimura | .................... H03H 3/02 |
| 2020/0169191 | A1* | 5/2020 | Kubota | ................. C04B 35/495 |

FOREIGN PATENT DOCUMENTS

| | | | | |
|---|---|---|---|---|
| KR | 10-2009-0072767 A1 | | 7/2009 | |
| KR | 10-2018-0071872 A | | 6/2018 | |
| KR | 20180071872 A | * | 6/2018 | ........... H01L 41/047 |
| WO | WO-2016203955 A1 | * | 12/2016 | ................ B41J 2/14 |

OTHER PUBLICATIONS

A. Brewer et al., "Microscopic piezoelectric behavior of clamped and membrane (001) PMN-30PT thin films", Applied Physics Letters, vol. 119, Issue 20, Nov. 15, 2021.
S. H. Baek et al., "Giant Piezoelectricity on Si for Hyperactive MEMS", Science, Nov. 18, 2011, vol. 334, Issue 6058, pp. 958-961.
International Search Report of PCT/KR2021/006803 mailed Sep. 27, 2021.

* cited by examiner (X - X)

(X-X)

PIEZOELECTRIC SINGLE-CRYSTAL ELEMENT, MEMS DEVICE USING SAME, AND METHOD FOR MANUFACTURING SAME

TECHNICAL FIELD

The present disclosure relates to a piezoelectric single-crystal element, a MEMS device using same, and a method for manufacturing same.

BACKGROUND

Since the development of PZT (lead zirconate titanate) piezoelectric ceramic in the 1950s, the PZT piezoelectric ceramics has been widely used as a piezoelectric material. Over the past 70 years, improvements in the properties of the material itself have not been made any more. On the other hand, in the piezoelectric material application field, new materials have been required to improve the performance of sensors, transducers, and the like.

In the 1980s, Professor Kuwata's group at Tokyo Institute of Technology in Japan and DARPA in the US have supported the development of new materials to improve a SONAR that detects submarines in the sea. A PZN-PT [$Pb(Zn_{2/3}Nb_{1/3})O_3$—$PbTiO_3$] single crystal and a PMN-PT [$Pb(Mg_{2/3}Nb_{1/3})O_3$—$PbTiO_3$] single crystal developed by Professor Tom Shrout's group were presented for the first time, thereby raising expectation for the advent of new piezoelectric materials. However, the main R&D was centered on PZN-PT, and the growth method thereof was also the Flux method, which had many problems in mass production of small single crystals.

Since then, many research results have been published. Lee Sang-gu, et al succeeded in growing a 1-cm-order single crystal of PMN using the Bridgman method for the first time in 1997 [Appl. Phys. Letts. Vol. 74, no. 7, 1030 (1999)]. This made it possible to grow a lead-based (Pb-containing oxide) large piezoelectric single crystal. Thus, the direction of research was switched to PMN-PT worldwide. Research of PMN-PT began in earnest, and PMN-PT began to be commercialized.

PMN-PT and PIN-PMN-PT piezoelectric single crystals, which show far superior piezoelectric properties as compared with existing PZT ceramics, have been called 'next-generation piezoelectric materials'. Currently, piezoelectric single-crystal materials with various compositions are being developed. In particular, a two-phase single-crystal (PMN-PT) material, which is a first generation single-crystal material, is widely used for ultrasonic transducers for medical devices, and a three-phase single-crystal (PIN-PMN-PT) material, which is a second generation single-crystal material, is widely used for military sonar sensors that require high output/environmental resistance.

Recently, in order to increase the mechanical quality factor while maintaining the piezoelectric constant of the existing first and second generation piezoelectric single crystals, research is ongoing to develop a third generation piezoelectric single-crystal material (Mn:PIN-PMN-PT) added with a dopant such as Mn or the like, and to use the third generation piezoelectric single-crystal material as a transmission sensor for high-power military sonar systems or to apply the third generation piezoelectric single-crystal material to industrial ultrasonic motors (see Table 1).

TABLE 1

Comparison of piezoelectric properties of existing piezoelectric single crystals of different generations

| Materials | Poling | Relative Dielectric Constant ε33(pC/N) | Piezoelectric Constant d33(pC/N) | Phase Transition Temperature Trt (degrees C.) | Coercive Field Ec (kV/cm) | Mechanical Quality Factor Qm |
|---|---|---|---|---|---|---|
| PMN-PT (1st Generation) | <001> | ≥5000 | 1500 to 2200 | ≥85 | ≥1.8 | ≥80 |
| PIN-PMN-PT (2nd Generation) | | ≥4000 | 1300 to 2200 | ≥120 | ≥4.5 | ≥100 |
| Mn: PIN-PMN-PT (3rd Generation) | | ≥2900 | 1080 to 1700 | ≥120 | ≥4.5 | ≥700 |
| PMN-PT (1st Generation) | <110> | ≥3500 | 1000 to 1500 | ≥75 | ≥1.8 | ≥400 |
| PIN-PMN-PT (2nd Generation) | | ≥3100 | 900 to 1300 | ≥110 | ≥4.5 | ≥500 |
| Mn: PIN-PMN-PT (3rd Generation) | | ≥2600 | 800 to 1100 | ≥110 | ≥8.0 | ≥1030 |

Ref: J. Luo, W. Hackenberger, S. Zhang and T. R. Shrout, The Progress Update of Relaxor Piezoelectric Single Crystals, 2009 IEEE International Ultrasonics Symposium Proceedings.

It has been reported that as shown in Table 1 above, the third generation piezoelectric single crystal is superior in coercive field and mechanical quality factor than the existing first and second generation piezoelectric single crystals. However, the third generation piezoelectric single crystal has a problem that the dielectric constant and the piezoelectric constant, which affect the sensitivity performance of a sensor, decrease. To solve this problem, domain engineering methods have been studied. Toshiba Corporation has announced that the piezoelectric constant and the dielectric constant were improved by applying an alternating current (AC) polling method to the first and second generation piezoelectric single-crystal transducers (U.S. Pat. No. 9,966,524B2). However, difficulties are involved in repolarization during the process, which makes it difficult to apply this technique widely in practice.

In addition, there is no process for forming a MEMS device using a third generation piezoelectric single crystal. Research is required to commercialize a new concept MEMS device manufactured through such a process. In particular, in order to use a piezoelectric single-crystal material as a medical ultrasonic element or a sensor element, it is necessary to manufacture a unit element having a certain size. The precision of the unit element required for a medical ultrasonic element or a sensor element is gradually increasing to a µm level beyond a mm level that can be manufactured through general machining.

SUMMARY

The embodiments of the present disclosure have been conceived to solve the aforementioned problems of the related art, and provide a novel lead-metal-compound piezoelectric single-crystal element in which the dielectric constant and the piezoelectric constant are dramatically increased by applying an alternating current and a direct current to both ends of a piezoelectric single crystal having electrodes and in which the coercive field (Ec) and the mechanical quality factor (Qm) of the piezoelectric single crystal are also significantly improved by adding a specific additive to the piezoelectric single crystal, a piezoelectric MEMS sensor using same, a vibration device, and a method for manufacturing same.

According to one aspect of the present disclosure, there may be provided a piezoelectric single-crystal element, comprising: a wafer; a lower electrode stacked on the wafer; a piezoelectric single-crystal thin film stacked on the lower electrode; and an upper electrode stacked on the piezoelectric single-crystal thin film, wherein the piezoelectric single-crystal thin film is composed of PMN-PT, PIN-PMN-PT or Mn:PIN-PMN-PT, and the piezoelectric single-crystal thin film has a polarization direction set to a <001> axis, a <011> axis or a <111> axis.

Further, there may be provided the piezoelectric single-crystal element wherein the upper electrode includes an operation-part-side upper terminal portion, the lower electrode includes an operation-part-side lower terminal portion, the piezoelectric single-crystal thin film has an operation part formation hole formed over the periphery of a central portion, the element further comprises a vibrable operation part defined as a central portion surrounded by the operation-part-side upper terminal portion, the operation-part-side lower terminal portion, and the operation part formation hole of the piezoelectric single-crystal thin film, and a lower operation space is formed below the operation part on the wafer to define the operation performance of the operation part.

Further, there may be provided the piezoelectric single-crystal element wherein a via hole is formed through the piezoelectric single-crystal thin film in a vertical direction, and the lower electrode includes a lower extension portion extending in one direction from the operation-part-side lower terminal portion, a lower connection portion connected to an end of the lower extension portion and arranged below the via hole, a vertical extension portion extending upward from the lower connection portion and formed inside the via hole, and a lower electrode terminal portion connected to an end of the vertical extension portion.

Further, there may be provided the piezoelectric single-crystal element wherein the upper electrode includes an upper extension portion extending in the other direction from the operation-part-side upper terminal portion, and an upper electrode terminal portion connected to an end of the upper extension portion, and the upper electrode terminal portion and the lower electrode terminal portion are positioned on the same level.

Further, there may be provided the piezoelectric single-crystal element wherein the operation-part-side upper terminal portion, the operation-part-side lower terminal portion and the central portion of the piezoelectric single-crystal thin film, which constitute the operation part, and the lower operation space are formed in a polygonal or circular shape.

Further, there may be provided the piezoelectric single-crystal element wherein the lower electrode, the piezoelectric single-crystal thin film and the upper electrode are formed so as to protrude further outward from one end of the wafer, so that protruding regions not supported by the wafer are formed in the lower electrode, the piezoelectric single-crystal thin film and the upper electrode, and the protruding regions are defined as a vibrable operation part.

Further, there may be provided the piezoelectric single-crystal element, further comprising: an operation frequency adjustment part stacked on the operation-part-side upper terminal portion and configured to adjust an operation frequency to resonate with the frequency of a vibration signal applied from the outside.

According to another aspect of the present disclosure, there may be provided a MEMS device, comprising: the piezoelectric single-crystal element recited above, wherein the MEMS device is configured to use an electric signal generated by the piezoelectric single-crystal element as an input when an electromagnetic force or a physical vibration signal is applied from the outside.

Further, there may be provided a MEMS device, comprising: the piezoelectric single-crystal element recited above, wherein the MEMS device is configured so that a physical vibration signal is generated and outputted by the piezoelectric single-crystal element when an electrical signal is applied from the outside.

Further, there may be provided a MEMS device, comprising: the piezoelectric single-crystal element recited above, wherein the MEMS device is configured to apply an electrical signal to generate and output a vibration signal of the piezoelectric single-crystal element and to input a signal generated by the piezoelectric single-crystal element from an external signal returned by reflection of the output signal.

Further, there may be provided a MEMS device, comprising: the piezoelectric single-crystal element recited above, wherein the MEMS device is configured to generate and apply an ultrasonic wave to the patient's skin, receive a signal reflected from the skin as an input again, and obtain a signal changed by heartbeat or muscle movement.

Further, there may be provided a MEMS device, comprising: the piezoelectric single-crystal element recited above, wherein the MEMS device is configured to generate an ultrasound wave, apply the ultrasound wave to the patient's skin, receive a signal reflected from the skin as an input again, and acquire an ultrasound image.

Further, there may be provided a MEMS device, comprising: the piezoelectric single-crystal element recited above, wherein the piezoelectric single-crystal element is configured to be used as one of a bulk acoustic filter (BAW Filter) element for wireless mobile communication of 6 GHz band or less using a bulk acoustic wave, a film bulk acoustic wave filter (FBAR Filter) element, an electronic microphone element serving as an accelerometer that converts a mechanical vibration of 200 Hz or less into an electrical signal, a mechanical-to-electrical signal transducer, and a single-crystal gyroscope element in which single-crystal cantilevers are arranged in a crisscross pattern.

According to a further aspect of the present disclosure, there may be provided a method for manufacturing a piezoelectric single-crystal element, comprising: a piezoelectric single-crystal thin film preparation step of preparing a piezoelectric single-crystal thin film; a lower electrode forming step of forming a lower electrode vapor-deposited on a lower surface of the piezoelectric single-crystal thin film; a lower electrode patterning step of forming a predetermined pattern on the lower electrode; a wafer bonding step of bonding a wafer to the lower surface of the piezoelectric single-crystal thin film on which the lower electrode is formed; a thin film trimming step of reducing the thickness of the piezoelectric single-crystal thin film; a piezoelectric single-crystal etching step of etching the piezoelectric single-crystal thin film to form a via hole and an operation part formation hole; an upper electrode vapor-deposition step of vapor-depositing and forming an upper electrode on the piezoelectric single-crystal thin film; an upper electrode patterning step of forming a predetermined pattern on the upper electrode; and a wafer etching step of etching an upper surface of the wafer to form a lower operation space to provide an operation part, wherein the piezoelectric single-crystal thin film is composed of PMN-PT, PIN-PMN-PT or Mn:PIN-PMN-PT, and the piezoelectric single-crystal thin film has a polarization direction set to a <001> axis, a <011> axis or a <111> axis.

Further, there may be provided the method further comprising: a lead-metal compound single-crystal modifying step, wherein the lead-metal compound single-crystal modifying step includes an alternating current applying step of applying an alternating current to an electrode of the piezoelectric single-crystal element, and a direct current applying step of applying a direct current to the electrode of the piezoelectric single-crystal element that has undergone the alternating current applying step.

According to the piezoelectric single-crystal element, the MEMS device using same, and the method for manufacturing same according to the embodiments of the present disclosure, a MEMS device is configured using a piezoelectric single crystal having an improved piezoelectric coefficient. Therefore, the MEMS device shows superior response characteristics as compared with the MEMS device of the related art, and can convert even a minute mechanical motion or a sound wave into an electrical signal. This makes it possible to commercialize a MEMS device that can easily detect a minute motion or a sound wave generated in the lung, heart, or other chest region of the human body.

In addition, it is possible to provide a MEMS sensor device that does not require a separate battery, can sense a vibration only with a self-generated current, and does not require a bias unlike the conventional capacitive MEMS sensor.

In addition, the dielectric constant and the piezoelectric constant can be dramatically increased by applying an alternating current and a direct current to both ends of a piezoelectric single crystal having electrodes, and the coercive field and the mechanical quality factor of the piezoelectric single crystal can also be significantly improved by adding a specific additive to the piezoelectric single crystal.

DETAILED DESCRIPTION

Figure 1:
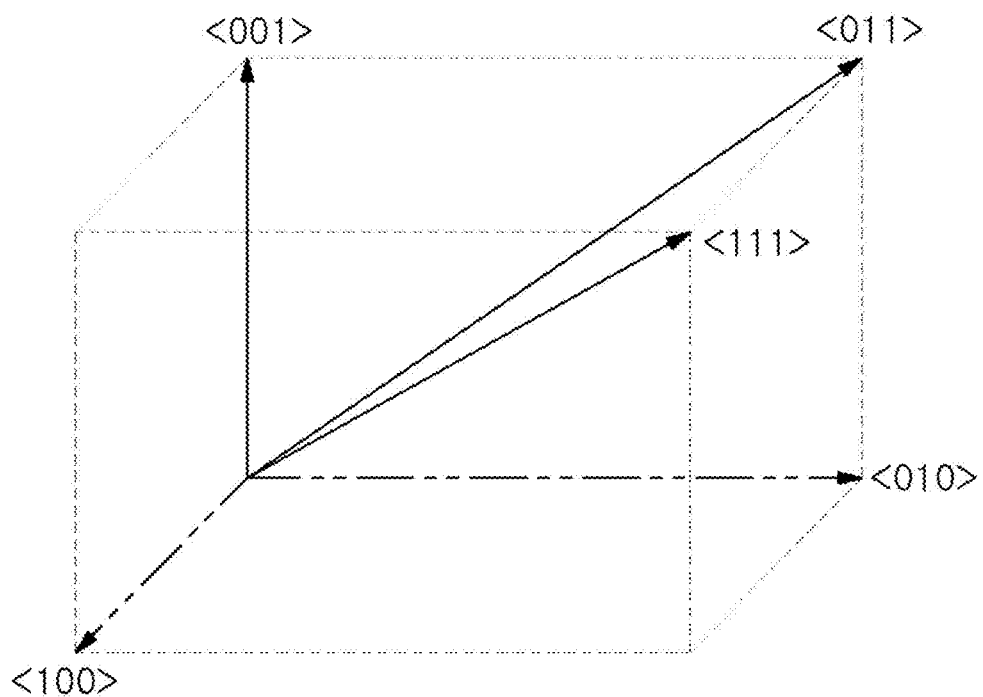
FIG. 1 is a diagram for explaining polarization directions of a piezoelectric single-crystal element according to an embodiment of the present disclosure.

Hereinafter, specific embodiments for implementing the spirit of the present disclosure will be described in detail with reference to the drawings.

In addition, in describing the present disclosure, if it is determined that a detailed description of a related known configuration or function may obscure the subject matter of the present disclosure, the detailed description thereof will be omitted.

In addition, when one component is referred to as being 'connected to', 'supported by' or 'in contact with' another component, it should be understood that one component may be directly connected to, supported by or in contact with another component and a further component may exist between one component and another component.

The terms used in the subject specification are only used to describe specific embodiments, and are not intended to limit the present disclosure. Singular expressions include plural expressions unless the context clearly indicates otherwise.

In addition, in the subject specification, expressions such as one side, the other side, and the like are defined with reference to the illustration in the drawings. It should be noted that if the direction of the corresponding object is changed, the object may be expressed differently. For the same reason, some components in the accompanying drawings are exaggerated, omitted, or schematically illustrated. The size of each component does not thoroughly reflect the actual size.

In addition, the terms including ordinal numbers such as first and second may be used to describe various components, but the corresponding components are not limited by such terms. These terms are only used for the purpose of distinguishing one component from another.

The meaning of "comprise" or "include" as used in the specification specifies a specific characteristic, region, integer, step, operation, element and/or component, and does not exclude the existence or addition of other specific characteristic, region, integer, step, operation, element, component and/or group.

The material of a piezoelectric single-crystal thin film applied to a piezoelectric single-crystal element according to an embodiment of the present disclosure may be PMN-PT (lead magnesium niobate-lead titanate), PIN-PMN-PT (lead indium niobate-lead magnesium niobate-lead titanate) or Mn:PIN-PMN-PT (manganese-doped lead indium niobate-lead magnesium niobate-lead titanate). In addition, referring to FIG. 1, for example, the polarization directions of a piezoelectric single-crystal thin film may be set to a <001> axis, a <011> axis, or a <111> axis.

Although the material properties of the piezoelectric single crystal according to the present embodiment are excellent, no process technique using the piezoelectric single crystal as a unit element has been known so far. In particular, although some process methods have been developed and published in the case of a piezoelectric ceramic, it is difficult to directly apply them to piezoelectric single-crystal processes for each unit process such as bonding, etching, or the like due to the difference in chemical composition. In addition, even if the performance of the piezoelectric single-crystal material is excellent, when the element-making process and the unit element structure are not suitable, it is very difficult to manufacture an element having a coercive field (Ec) and a mechanical quality factor (Qm) of a piezoelectric single crystal required for medical elements or sensor elements. According to the present embodiment, it is possible to present a MEMS processing process capable of effectively manufacturing a high-density/subminiature element using the piezoelectric single crystal having such excellent characteristics.

Ceramic powder is put into a platinum crucible loaded with seeds in the crystal growth directions (<001>, <011> and <111> axes). The platinum crucible is sealed. The ceramic powder is left in a high-temperature crystal growth furnace for a long time and is completely melted. Thereafter, the ceramic powder is maintained at a constant temperature for a predetermined period of time and is then slowly cooled. As a result, an ingot for manufacturing a piezoelectric single-crystal thin film of a homogeneous composition can be obtained.

A piezoelectric single-crystal thin film can be manufactured using the ingot thus obtained. The piezoelectric single-crystal thin film may be provided in the form of a thin film, and may have a thickness of 5 nm to 80 μm, 6 nm to 65 μm, 7 nm to 70 μm, or 10 nm to 10 μm.

Hereinafter, the detailed configuration of a piezoelectric single-crystal element manufactured using the piezoelectric single-crystal thin film will be described with reference to the drawings.

Figure 2:
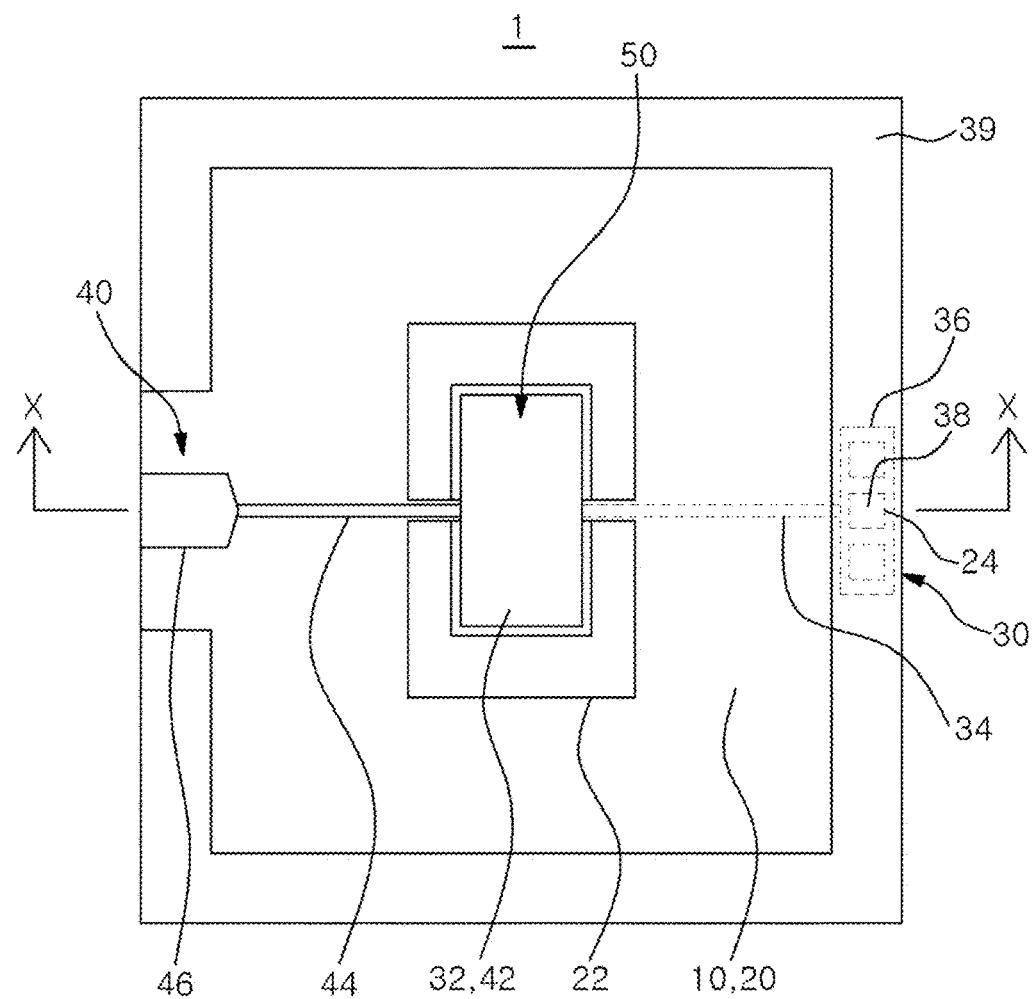
FIG. 2 is a plan view illustrating a piezoelectric single-crystal element according to an embodiment of the present disclosure.
Figure 3:
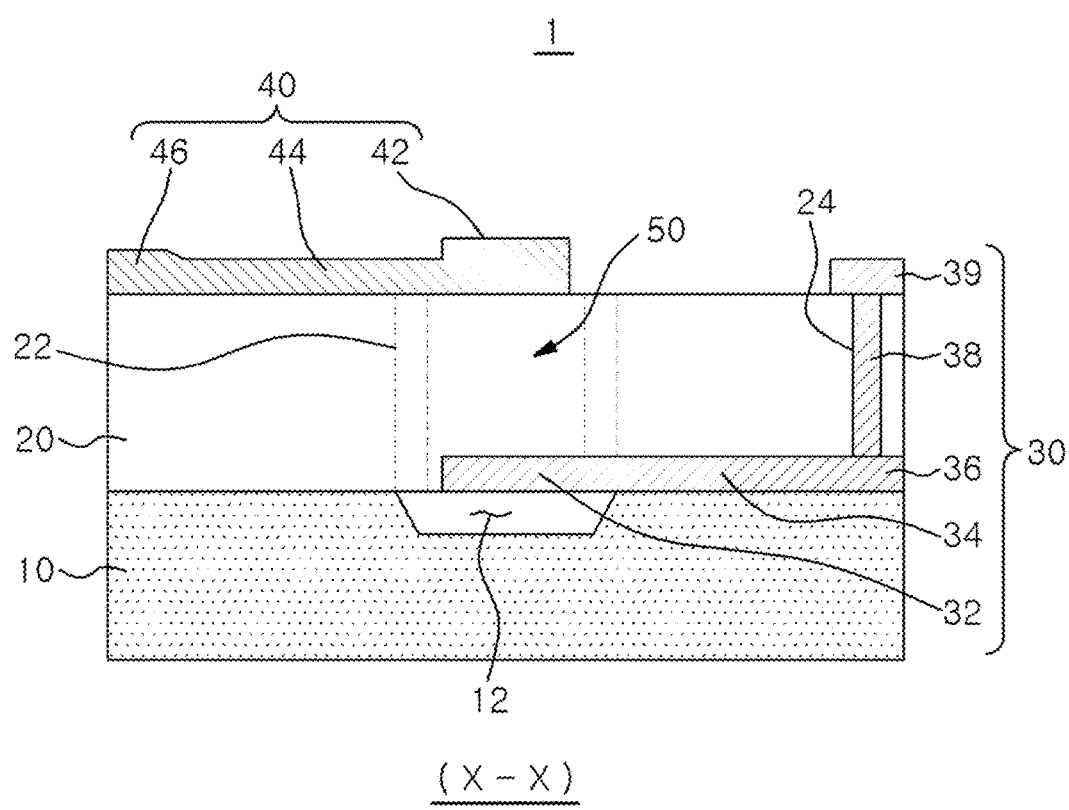
FIG. 3 is a sectional view taken along line X-X in FIG. 2.

Referring to FIGS. 2 and 3, the piezoelectric single-crystal element 1 according to an embodiment of the present invention may have a structure in which a plurality of layers is stacked, and may include a wafer 10, a piezoelectric single-crystal thin film 20, a lower electrode 30, and an upper electrode 40. The piezoelectric single-crystal element 1 may be formed by stacking the wafer 10, the lower electrode 30, the piezoelectric single-crystal thin film 20, and the upper electrode 40 in the named order.

The wafer 10 may be provided as a base substrate of the piezoelectric single-crystal element 1, and may be made of Si, $SiO_2$, $Al_2O_3$, ZnO, or the like. A lower operation space 12 may be formed in the wafer 10, and a space for enabling vibration of an operation part 50 to be described later may be provided by the lower operation space 12.

The piezoelectric single-crystal thin film 20 may be manufactured using PMN-PT or PIN-PMN-PT as a material. In addition, an operation part formation hole 22 may be formed on the wafer 10 together with the lower operation space 12 so as to surround the operation part 50 with respect to a below-described peripheral portion of the operation part 50. In addition, a via hole 24 through which a part of the lower electrode 30 passes may be formed in the piezoelectric single-crystal thin film 20. In addition, the operation part formation hole 22 may be formed so as not to interfere with a below-described upper extension portion 44 of the upper electrode 40 and a below-described lower extension portion 34 of the lower electrode 30 in the vertical direction.

The lower electrode 30 may be stacked on the wafer 10 and partially extend to the same level as the upper electrode 40 through the via hole 24 formed in the piezoelectric single-crystal thin film 20. The lower electrode 30 may be made of aluminum, gold, silver, platinum, titanium, chromium, copper, or the like. The lower electrode 30 may include an operation-part-side lower terminal portion 32, a lower extension portion 34, a lower connection portion 36, a vertical extension portion 38, and a lower electrode terminal portion 39.

The operation-part-side lower terminal portion 32 constitutes a lower surface of the operation part 50 and may be positioned below the central portion of the piezoelectric single-crystal thin film 20. In addition, the operation-part-side lower terminal unit 32 may be provided on the lower operation space 12. The lower extension portion 34 may extend in one direction from the operation-part-side lower terminal portion 32, and the lower connection portion 36 may be connected to an end thereof. The lower connection portion 36 may be formed to be disposed below the via hole 24. The vertical extension portion 38 extends upward from the lower connection portion 36 and may be formed inside the via hole 24. The inside of the via hole 24 may be filled with the vertical extension portion 38. The lower electrode terminal portion 39 is connected to an end of the vertical extension portion 38 and may be formed to cover a portion of the upper surface of the piezoelectric single-crystal thin film 20. In addition, the lower electrode terminal portion 39 may extend in a horizontal direction so as to correspond to the four corners of the upper surface of the piezoelectric single-crystal thin film 20. The operation-part-side lower terminal portion 32, the lower extension portion 34, the lower connection portion 36, the vertical extension portion 38, and the lower electrode terminal portion 39 may all be electrically connected to each other, and may be integrally formed by a patterning process using vapor deposition and etching.

The upper electrode 40 may be stacked on the piezoelectric single-crystal thin film 20. The upper electrode 40 may be made of aluminum, gold, silver, platinum, titanium, chromium, copper, or the like. Moreover, the upper electrode 40 may be formed in a state in which it is electrically disconnected from the lower electrode 30. The upper electrode 40 and the lower electrode 30 may be connected as an anode and a cathode, respectively, when forming a circuit for a MEMS device.

The operation-part-side upper terminal portion 42 constitutes an upper surface of the operation part 50 and may be positioned above the central portion of the piezoelectric single-crystal thin film 20. The upper extension portion 44 may extend in one direction from the operation-part-side upper terminal portion 42. At this time, the direction in which the upper extension portion 44 extends may be opposite to the direction in which the lower extension portion 34 extends. Further, an upper electrode terminal portion 46 may be connected to an end of the upper extension portion 44. The upper electrode terminal portion 46 may be formed to cover a portion of the upper surface of the piezoelectric single-crystal thin film 20. At this time, the upper electrode terminal portion 46 may be formed on the same plane as the lower electrode terminal portion 39, and may be spaced apart from the lower electrode terminal portion 39 so that they are not connected to each other. The operation-part-side upper terminal portion 42, the upper extension portion 44, and the upper electrode terminal portion 46 may all be electrically connected to each other, and may be integrally formed by a patterning process using vapor deposition and etching.

The operation part 50 may be defined as a central part surrounded by the operation-part-side upper terminal portion 42 of the upper electrode 40, the operation-part-side lower terminal portion 32 of the lower electrode 30, and the operation part formation hole 22 of the piezoelectric single-crystal thin film 20. A lower operation space 12 may be formed below the operation part 50 to provide a space in which the element can vibrate. Accordingly, when a vibration such as a sound wave or the like is applied from the outside, the operation part 50 generates a vibration in response thereto, so that a current can be generated in the piezoelectric single-crystal thin film 20.

Figure 5:
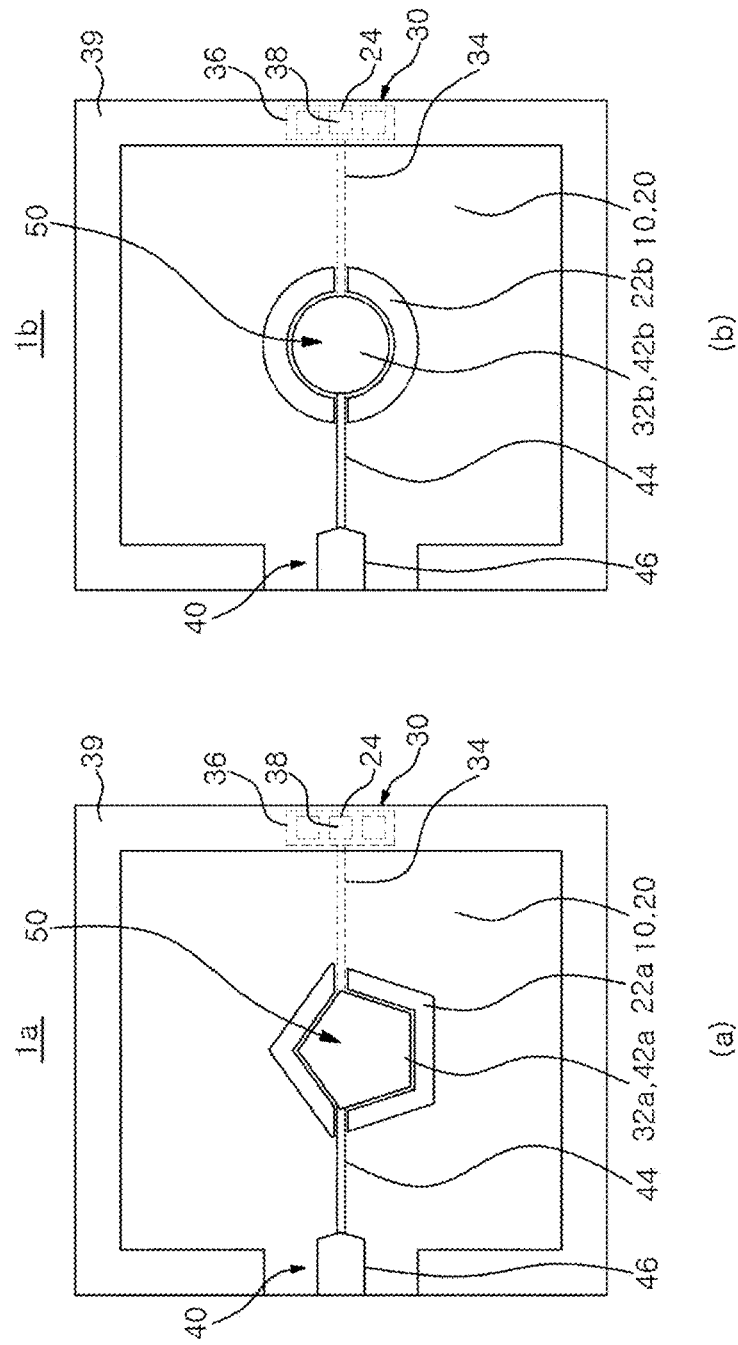
FIG. 5 shows plan views (a) and (b) illustrating modifications of the piezoelectric single-crystal element shown in FIG. 2.

In addition, the operation part 50 may be formed in a rectangular shape when viewed from above. Accordingly, the operation-part-side upper terminal portion 42 and the operation-part-side lower terminal portion 32 may also be formed in a rectangular shape. However, this is nothing more than an example, and the spirit of the present disclosure is not limited thereto. For example, as shown in FIG. 5A, the operation-part-side lower terminal portion 32a and the operation-part-side upper terminal portion 42a of the piezoelectric single-crystal element 1a may be formed in a triangular or other polygonal shapes. Similarly, the operation part formation hole 22a may also be formed in a triangular or other polygonal shapes. In addition, as shown in FIG. 5B, the operation-part-side lower terminal portion 32b and the operation-part-side upper terminal portion 42b of the piezoelectric single-crystal element 1b may be formed in a circular shape. Similarly, the operation part formation hole 22b may also be formed in a circular shape.

Figure 4:
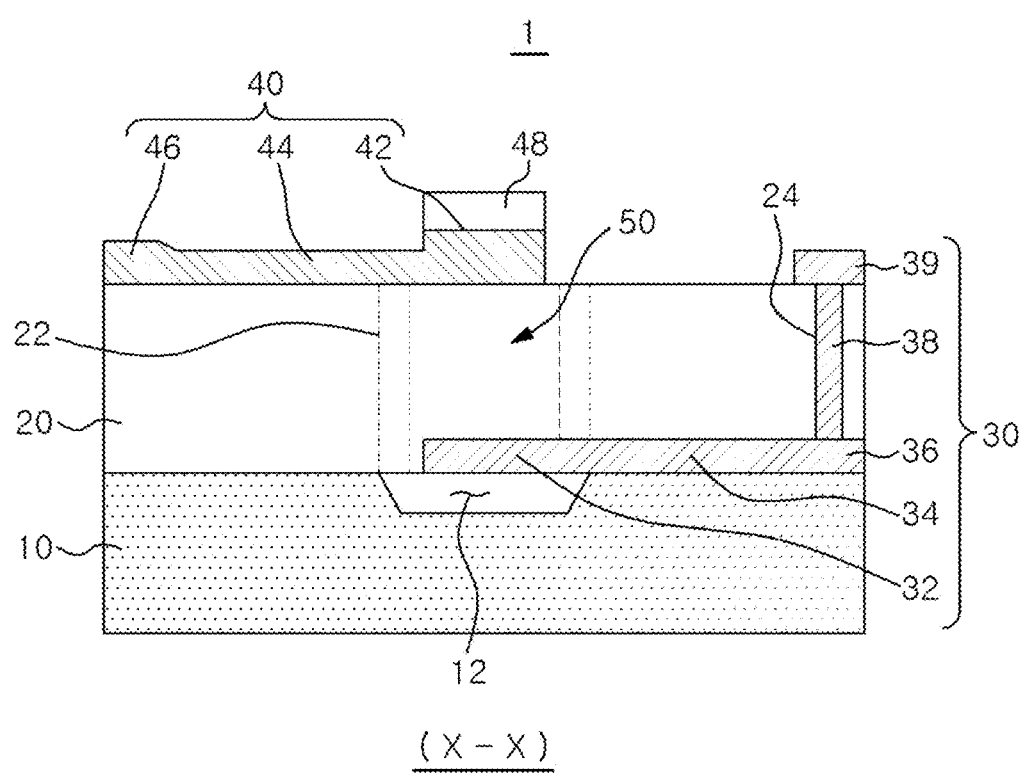
FIG. 4 is a sectional view showing a modification of the piezoelectric single-crystal element shown in FIG. 3.

FIG. 4 shows a modification of the piezoelectric single-crystal element according to the present embodiment. Referring to FIG. 4, the piezoelectric single-crystal element may further include an operation frequency adjustment part 48 stacked on the operation-part-side upper terminal portion 46 and configured to adjust the operation frequency so as to resonate with the frequency of the vibration signal applied from the outside.

Figure 6:
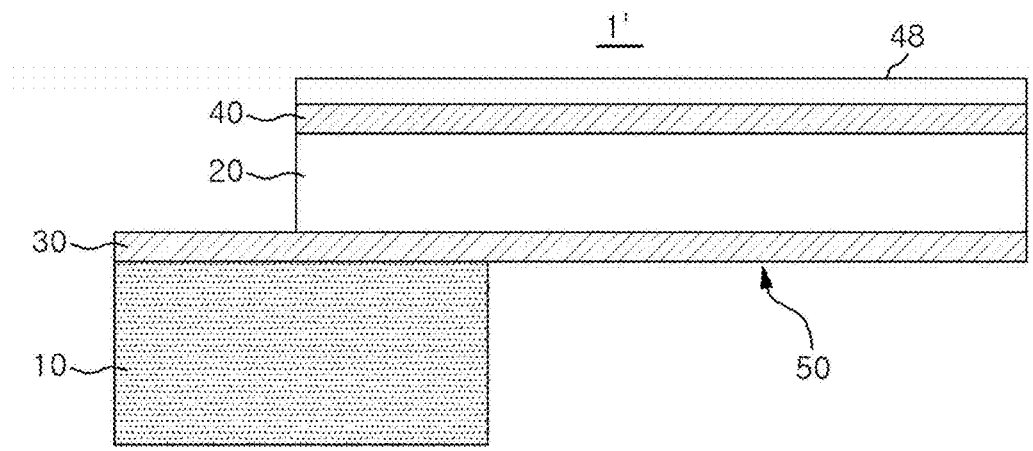
FIG. 6 is a sectional view showing another embodiment of the piezoelectric single-crystal element shown in FIG. 3.

Meanwhile, FIG. 6 shows a configuration of a piezoelectric single-crystal element according to another embodiment of the present disclosure. Hereinafter, the specific configuration of the piezoelectric single crystal element according to another embodiment of the present disclosure will be described with reference to the drawings.

Referring to FIG. 6, the piezoelectric single-crystal element 1' according to this embodiment is the same as the piezoelectric single-crystal element of the above-described embodiment in that the lower electrode 30, the piezoelectric single-crystal thin film 20, and the upper electrode 40 are sequentially stacked on the wafer 10. However, the piezoelectric single-crystal element 1' may have a structure in which the lower electrode 30 is formed to protrude further outward from one end of the wafer 10, and the piezoelectric single-crystal thin film 20 and the upper electrode 40 are stacked on the lower electrode 30 protruding outward from the wafer 10. In other words, the piezoelectric single-crystal element 1' may be configured in a so-called cantilever type in which the protruding regions not supported by the wafer 10 are formed on the lower electrode 30, the piezoelectric single-crystal thin film 20, and the upper electrode 40. In this way, the operation part 50 may be composed of the portions not supported by the wafer 10 in the lower electrode 30, the piezoelectric single-crystal thin film 20, and the upper electrode 40.

In addition, it may be possible to adopt a configuration in which both the upper electrode and the lower electrode are formed on the upper surface of the piezoelectric single-crystal thin film.

Hereinafter, a method for manufacturing the piezoelectric single-crystal element having the above configuration will be described with reference to FIGS. 7A to 7I.

Referring to FIGS. 7A to 7I, the method for manufacturing a piezoelectric single-crystal element according to an embodiment of the present disclosure may include a piezoelectric single-crystal thin film preparation step (FIG. 7A) of preparing a piezoelectric single-crystal thin film 20. At this time, the lower surface of the piezoelectric single-crystal thin film 20 may be subjected to optical surface processing (polishing).

The method may include a lower electrode forming step (FIG. 7B) of forming a lower electrode 30 on the lower surface of the prepared piezoelectric single-crystal thin film 20. When forming the lower electrode 30, metal such as chromium, nickel-chromium, or titanium is vapor-deposited as an electrode bonding surface using a vapor deposition apparatus. Gold or platinum may be used as the lower electrode 30. The method may include a lower electrode patterning step (FIG. 7C) of forming a predetermined pattern on the vapor-deposited lower electrode 30. The lower electrode patterning step may be performed using a mask aligner (exposure equipment). The shape of the lower electrode 30 may be prepared through this lower electrode patterning step. Specifically, an operation-part-side lower terminal portion 32, a lower extension portion 34, and a lower connection portion 36 may be formed.

The method may include a wafer bonding step (FIG. 7D) of bonding a wafer 10 to the lower surface of the piezoelectric single-crystal thin film 20 on which the lower electrode 30 is formed. The wafer 10 may be formed at a thickness of several micrometers to several millimeters, and may be made of Si, $SiO_2$, $Al_2O_3$, ZnO, or the like. The piezoelectric single-crystal thin film 20, on which the lower electrode 30 is formed, and the wafer 10 may be bonded by a bonding method such as epoxy bonding, eutectic bonding, or anodic bonding. At this time, a separation space may be partially formed between the wafer 10 and the piezoelectric single-crystal thin film 20 by the portion removed in the lower electrode patterning step. This space is as small as about 200 nanometers and may be substantially eliminated as it is filled with an adhesive material such as epoxy or the like, or as the upper surface of the wafer 10 and the piezoelectric single-crystal thin film 20 come closer to each other by eutectic bonding or anodic bonding.

The method may include a thin film trimming step (FIG. 7E) of reducing the thickness of the piezoelectric single-crystal thin film 20. A CMP process may be performed to reduce the thickness of the piezoelectric single-crystal thin film 20. At this time, the thickness of the piezoelectric single-crystal thin film 20 subjected to the CMP process may be determined according to the design frequency of the MEMS device and the operation mode of the piezoelectric single-crystal element. In general, several kHz to several GHz may be applied.

The method may include a piezoelectric single-crystal etching step (FIG. 7F) of etching the piezoelectric single-crystal thin film 20 after the thin film trimming step. To this end, a seed layer is vapor-deposited on the piezoelectric single-crystal thin film 20 and is subjected to PR patterning. Thereafter, nickel (Ni) plating may be performed at a thickness of 5 μm or more. An etch mask may be formed by removing portions of the seed layer other than the nickelpatterned portion of the seed layer. In a state where the piezoelectric single-crystal thin film 20 and the wafer 10 having the etching mask formed thereon are mounted on the NRD equipment, the piezoelectric single-crystal thin film 20 may be etched to the surface of the wafer 10. Through this piezoelectric single-crystal etching step, an operation part formation hole 22 and a via hole 24 may be formed in the piezoelectric single-crystal thin film 20.

The method may include an upper electrode vapor deposition step (FIG. 7G) of vapor-depositing and forming an upper electrode 40 on the etched piezoelectric single-crystal thin film 20. On the piezoelectric single-crystal thin film 20, a metal such as chromium, nickel-chromium, or titanium is vapor-deposited as an electrode bonding surface using a vapor deposition equipment just like the lower electrode 30. Gold or platinum may be used as the upper electrode 40. As the upper electrode vapor deposition step progresses, the via hole 24 may also be filled with a metal material constituting the upper electrode, whereby a vertical extension portion 38 may be formed.

The method may include an upper electrode patterning step (FIG. 7H) of forming a predetermined pattern on the vapor-deposited upper electrode 40 after the upper electrode 40 is vapor-deposited. The upper electrode patterning step may be performed using a mask aligner (exposure equipment). The shape of the upper electrode 40 may be prepared through this upper electrode patterning step. Specifically, an operation-part-side upper terminal portion 42, an upper extension portion 44, an upper electrode terminal portion 46, and a lower electrode terminal portion 39 may be formed.

Figure 7:
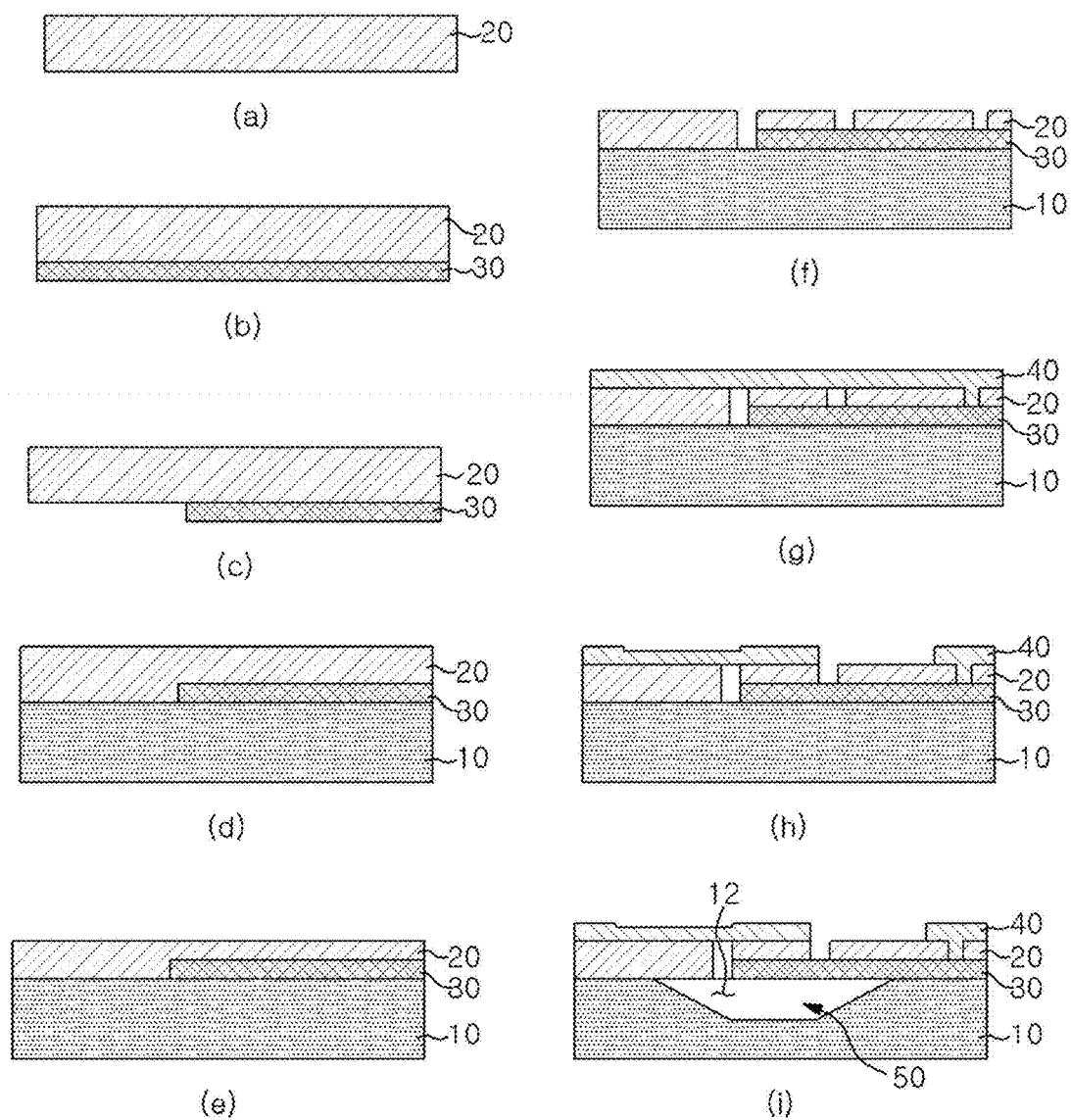
FIG. 7 shows conceptual diagrams (a)-(i) illustrating a method of manufacturing the piezoelectric single-crystal element shown in FIG. 2.

Finally, the method may include a wafer etching step (FIG. 7I of etching the upper surface of the wafer 10 to form an operation part 50. The wafer etching step may be performed using a XeF$_2$ etching device, and may be performed through the operation part formation hole 22 formed in the piezoelectric single-crystal thin film 20. As a result, a lower operation space 12 may be formed in the wafer 10, thereby enabling the vibration operation of the operation part 50.

In addition, the method for manufacturing the piezoelectric single-crystal element may further include a lead-metal compound single-crystal modifying step. As used herein, the term "lead-metal compound" may mean a mixture of a lead compound including lead oxide and a metal compound including metal oxide.

The lead-metal compound single-crystal modifying step may include an alternating current applying step of applying an alternating current to the electrode of the piezoelectric single-crystal element and a direct current applying step of applying a direct current to the electrode of the piezoelectric single-crystal element that has undergone the alternating current applying step.

In addition, the lead-metal compound single-crystal modifying step may further include an electrode direct current applying step of applying a direct current to the electrode of the piezoelectric single-crystal element before the alternating current applying step.

In addition, the lead-metal compound single-crystal modifying step may further include a depolarization step of heating the piezoelectric single-crystal element that has undergone the electrode direct current applying step to a Curie temperature or higher after the electrode direct current applying step and before the alternating current applying step. This depolarization step may be performed for 2 to 5 hours.

Through this process, a piezoelectric single-crystal element can be manufactured. The piezoelectric single-crystal element thus manufactured may be provided as a MEMS device after going through a packaging process. The MEMS device including the piezoelectric single-crystal element may be provided as a so-called passive element device configured to generate and output an electrical signal by the piezoelectric single-crystal element when an electromagnetic force or a physical vibration signal is applied from the outside, or as a so-called active element device configured to generate and output a physical vibration signal by the piezoelectric single-crystal element when an electrical signal is applied from the outside. In addition, an electrical signal may be applied to generate and output a vibration signal of the piezoelectric single-crystal element, and a signal generated in the piezoelectric single-crystal element from an external signal returned by reflection of the output signal may be inputted.

Figure 8:
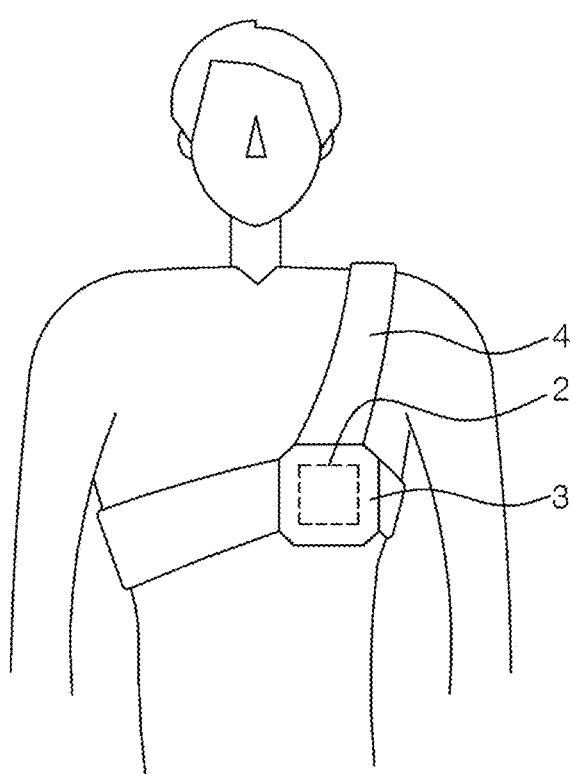
FIG. 8 is a diagram showing an application example in which a MEMS device according to an embodiment of the present disclosure is applied to a health care device.
Figure 9:
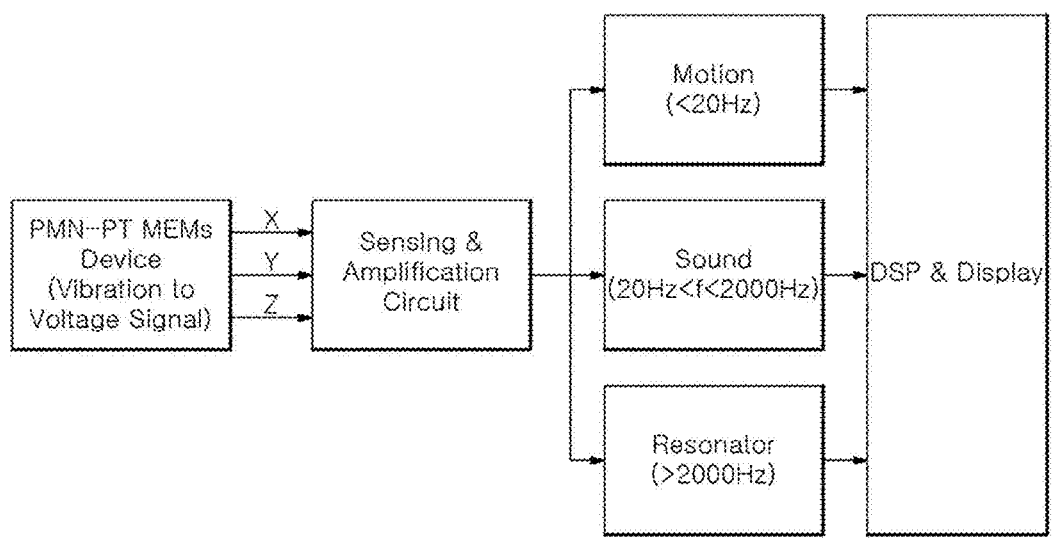
FIG. 9 is a signal-processing flowchart showing a system to which the MEMS device using the piezoelectric single-crystal element of FIG. 2 is applied.

For example, as shown in FIGS. 8 and 9, the MEMS device using the piezoelectric single-crystal element may be used as a wearable health care device that can be worn on a user's body to sense a bio signal such as a heart impulse or the like. Specifically, referring to FIGS. 8 and 9, the MEMS device 2 using the piezoelectric single-crystal element according to the embodiment of the present disclosure may be provided as a vibration sensor and may be used by being mounted inside a casing 3. At this time, the MEMS device 2 may be provided by packaging one or more piezoelectric single-crystal elements 1 through a packaging process, and may be provided in the casing 3 so as to adhere to the human body. In addition, a band member 4 may be connected to the casing 3. For example, the band member 4 may be provided to cover the user's body at the user's shoulders and the lower parts of both armpits.

The MEMS device 2 may detect various vibrations sensed through the user's body, i.e., vibration signals such as a cardiac impulse and a sound wave generated from the blood, the lung and the like, and may convert them into electrical signals. At this time, the operation of converting the vibration signals into electrical signals is made possible by the characteristics of the piezoelectric single-crystal element 1. Specifically, as the vibration signal transmitted from the outside is applied to the operation part 50 of the piezoelectric single-crystal element 1, the operation part 50 vibrates and consequently generates a minute current in the piezoelectric single-crystal thin film 20 so that the upper electrode 40 and the lower electrode 30 can be temporarily electrically connected. The vibration signals can be converted into a current signal through this mechanism.

The converted current signal may be amplified through an amplification circuit and may be classified into a motion, a sound, or a resonator according to the frequency thereof. The current signal may be displayed according to the classification result to present a signal sensing result so that the user can check a bio signal detection result. For example, the current signal may be classified as a motion when the vibration frequency is less than 20 Hz, classified as a sound wave when the vibration frequency is 20 Hz or more and less than 2000 Hz, and classified as a resonator when the vibration frequency is 2000 Hz or more. However, this is nothing more than an example, and the spirit of the present disclosure is not limited thereto.

However, this application of the MEMS device is nothing more than an example, and may be applied to any field as long as a sensor for sensing a vibration can be used. The MEMS device can be widely used in a medical, industrial, or military system.

For example, the MEMS device may be configured to output a vibration signal of the piezoelectric single-crystal element by applying an electrical signal, and may input a signal generated in the piezoelectric single-crystal element from an external signal returned by reflection of the output signal. Alternatively, the MEMS device may be configured to generate and apply an ultrasonic wave to the patient's skin, receive a signal reflected from the skin as an input again, obtain a signal changed by heartbeat or muscle movement, or obtain an ultrasound image. Alternatively, the piezoelectric single-crystal element may be configured to be used as one of a bulk acoustic filter (BAW Filter) element for wireless mobile communication of 6 GHz band or less using a bulk acoustic wave, a film bulk acoustic wave filter (FBAR Filter) element, an electronic microphone element serving as an accelerometer that converts a mechanical vibration of 200 Hz or less into an electrical signal, a mechanical-to-electrical signal transducer, and a single-crystal gyroscope element in which single-crystal cantilevers are arranged in a crisscross pattern.

According to the piezoelectric single-crystal element, the MEMS device using same, and the method for manufacturing same according to the embodiment of the present disclosure having the configuration as described above, the dielectric constant and the piezoelectric constant can be dramatically increased by alternately applying an alternating current and a direct current to both ends of a piezoelectric single crystal having electrodes, and the coercive field (Ec) and the mechanical quality factor (Qm) of the piezoelectric single crystal can also be significantly improved by adding a specific additive to the piezoelectric single crystal.

Figure 10:
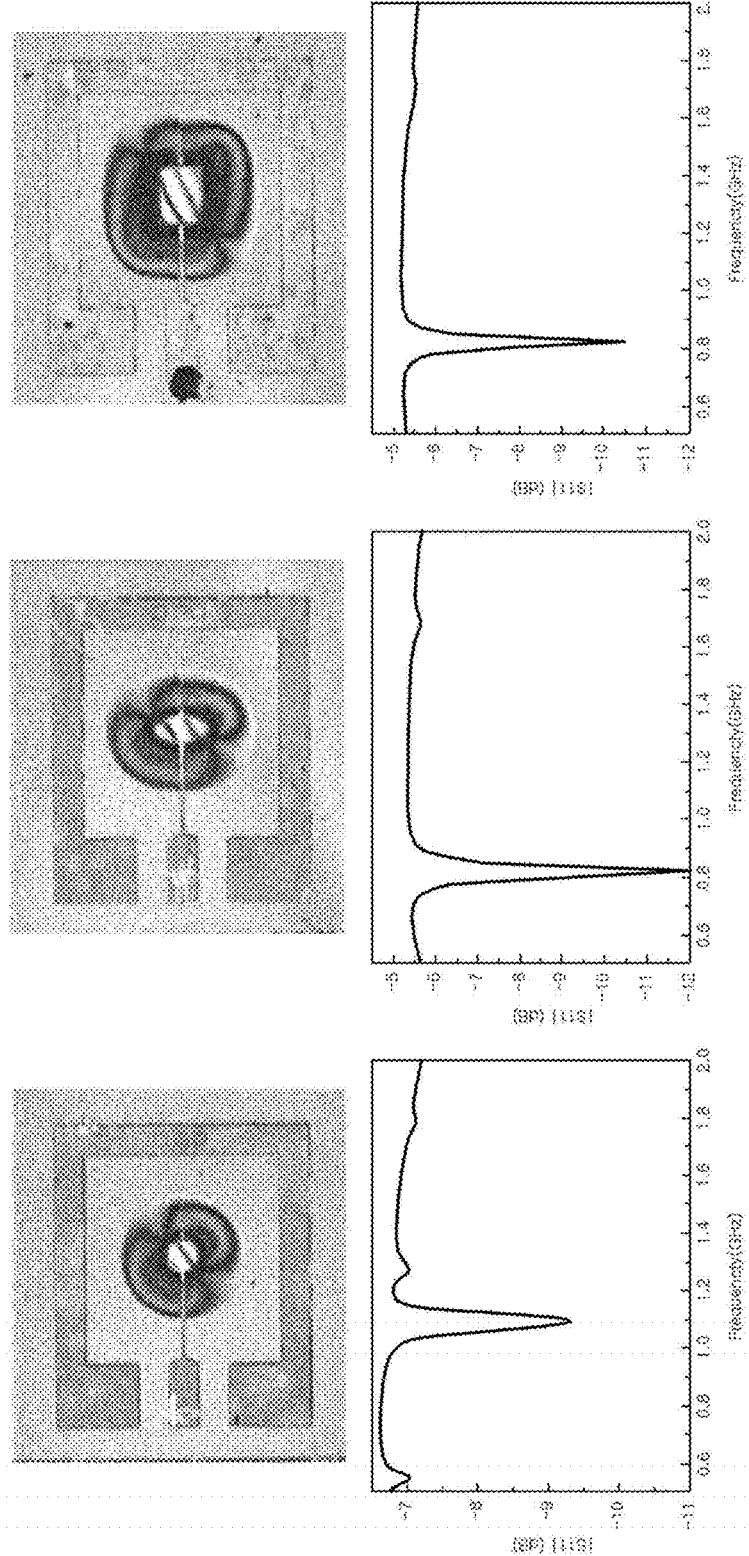
FIG. 10 is an experimental result graph showing response characteristics of the piezoelectric single-crystal element according to an embodiment of the present disclosure.

In addition, as a result of testing the response characteristics of the piezoelectric single-crystal element manufactured by the manufacturing method as described above, it was confirmed that the piezoelectric single-crystal element shows excellent response characteristics as can be seen in the graph of FIG. 10. It is possible to convert fine mechanical motions or sound waves into electrical signals, whereby motions or sound waves generated in the lungs, the heart or other chest parts of the human body can be easily sensed. Moreover, a separate battery is not required, and a vibration can be sensed only with the current generated by itself. In addition, a bias becomes unnecessary.

While the embodiments of the present disclosure have been described above as specific examples, these embodiments are nothing more than examples. The present disclosure is not limited thereto, and should be construed as having the widest scope in accordance with the basic idea disclosed herein. Those skilled in the art may combine or substitute the disclosed embodiments to implement a pattern of a shape not indicated herein. This also does not depart from the scope of the present disclosure. In addition, those skilled in the art may easily change or modify the disclosed embodiments based on the subject specification. It is apparent that such changes or modifications also belong to the scope of the present disclosure.

What is claimed is:

1. A piezoelectric single-crystal element, comprising:
   a wafer;
   a lower electrode stacked on the wafer;
   a piezoelectric single-crystal thin film stacked on the lower electrode; and
   an upper electrode stacked on the piezoelectric single-crystal thin film,
   wherein the piezoelectric single-crystal thin film is composed of PMN-PT, PIN-PMN-PT or Mn:PIN-PMN-PT, and
   the piezoelectric single-crystal thin film has a polarization direction set to a <001> axis, a <011> axis or a <111> axis,
   wherein the upper electrode includes an operation-part-side upper terminal portion,
   the lower electrode includes an operation-part-side lower terminal portion,
   the piezoelectric single-crystal thin film has an operation part formation hole formed over the periphery of a central portion,
   the element further comprises a vibrable operation part defined as a central portion surrounded by the operation-part-side upper terminal portion, the operation-part-side lower terminal portion, and the operation part formation hole of the piezoelectric single-crystal thin film, and
   a lower operation space is formed below the operation part on the wafer to define the operation performance of the operation part.

2. The element of claim 1, wherein a via hole is formed through the piezoelectric single-crystal thin film in a vertical direction, and
   the lower electrode includes a lower extension portion extending in one direction from the operation-part-side lower terminal portion, a lower connection portion connected to an end of the lower extension portion and arranged below the via hole, a vertical extension portion extending upward from the lower connection portion and formed inside the via hole, and a lower electrode terminal portion connected to an end of the vertical extension portion.

3. The element of claim 2, wherein the upper electrode includes an upper extension portion extending in the other direction from the operation-part-side upper terminal portion, and an upper electrode terminal portion connected to an end of the upper extension portion, and
   the upper electrode terminal portion and the lower electrode terminal portion are positioned on the same level.

4. The element of claim 1, wherein the operation-part-side upper terminal portion, the operation-part-side lower terminal portion and the central portion of the piezoelectric single-crystal thin film, which constitute the operation part, and the lower operation space are formed in a polygonal or circular shape.

5. The element of claim 1, wherein the lower electrode, the piezoelectric single-crystal thin film and the upper electrode are formed so as to protrude further outward from one end of the wafer, so that protruding regions not supported by the wafer are formed in the lower electrode, the piezoelectric single-crystal thin film and the upper electrode, and
   the protruding regions are defined as a vibrable operation part.

6. The element of claim 1, further comprising:
   an operation frequency adjustment part stacked on the operation-part-side upper terminal portion and configured to adjust an operation frequency to resonate with the frequency of a vibration signal applied from the outside.

7. A MEMS device, comprising:
   the piezoelectric single-crystal element of claim 1,
   wherein the MEMS device is configured to use an electric signal generated by the piezoelectric single-crystal element as an input when an electromagnetic force or a physical vibration signal is applied from the outside.

8. A MEMS device, comprising:
   the piezoelectric single-crystal element of claim 1,
   wherein the MEMS device is configured so that a physical vibration signal is generated and outputted by the piezoelectric single-crystal element when an electrical signal is applied from the outside.

9. A MEMS device, comprising:

the piezoelectric single-crystal element of claim 1, wherein the MEMS device is configured to apply an electrical signal to generate and output a vibration signal of the piezoelectric single-crystal element and to input a signal generated by the piezoelectric single-crystal element from an external signal returned by reflection of the output signal.

10. A MEMS device, comprising:

the piezoelectric single-crystal element of claim 1, wherein the MEMS device is configured to generate and apply an ultrasonic wave to the patient's skin, receive a signal reflected from the skin as an input again, and obtain a signal changed by heartbeat or muscle movement.

11. A MEMS device, comprising:

the piezoelectric single-crystal element of claim 1, wherein the MEMS device is configured to generate an ultrasound wave, apply the ultrasound wave to the patient's skin, receive a signal reflected from the skin as an input again, and acquire an ultrasound image.

12. A MEMS device, comprising:

the piezoelectric single-crystal element of claim 1, wherein the piezoelectric single-crystal element is configured to be used as one of a bulk acoustic filter (BAW Filter) element for wireless mobile communication of 6 GHz band or less using a bulk acoustic wave, a film bulk acoustic wave filter (FBAR Filter) element, an electronic microphone element serving as an accelerometer that converts a mechanical vibration of 200 Hz or less into an electrical signal, a mechanical-to-electrical signal transducer, and a single-crystal gyroscope element in which single-crystal cantilevers are arranged in a crisscross pattern.

* * * * *